United States Patent [19]

Miyamoto

[11] Patent Number: 4,616,143
[45] Date of Patent: Oct. 7, 1986

[54] HIGH VOLTAGE BOOTSTRAPPING BUFFER CIRCUIT

[75] Inventor: Junichi Miyamoto, Yokohama, Japan

[73] Assignee: Kabushiki Kaisha Toshiba, Kawasaki, Japan

[21] Appl. No.: 645,627

[22] Filed: Aug. 30, 1984

[30] Foreign Application Priority Data

Aug. 31, 1983 [JP] Japan ................. 58-160123

[51] Int. Cl.[4] .............. H03K 17/10; H03K 3/027; H03K 17/687; G11C 11/40
[52] U.S. Cl. .................... 307/264; 307/451; 307/475; 307/482; 307/578; 307/279; 365/104; 365/226
[58] Field of Search ............. 307/450, 451, 452, 453, 307/475, 482, 571, 578, 579, 581, 584, 585, 270, 264, 279; 365/104, 226, 203, 227, 228

[56] References Cited

U.S. PATENT DOCUMENTS

| | | | |
|---|---|---|---|
| 3,691,537 | 9/1972 | Burgess et al. | 307/578 X |
| 3,845,324 | 10/1974 | Feucht | 307/482 X |
| 4,284,905 | 8/1981 | Rosenzweig | 307/482 |
| 4,400,799 | 8/1983 | Gudger | 365/228 X |
| 4,442,481 | 4/1984 | Brahmbhatt | 365/226 X |
| 4,468,576 | 8/1984 | Takemae | 307/578 X |
| 4,486,670 | 12/1984 | Chan et al. | 307/279 X |
| 4,504,747 | 3/1985 | Smith et al. | 307/279 X |
| 4,555,644 | 11/1985 | Devecchi et al. | 307/450 X |
| 4,565,932 | 1/1986 | Kuo et al. | 307/475 X |

OTHER PUBLICATIONS

Dham, Vinod K., et al, "A 5V-Only E$^2$PROM Using 1.5 Micron Lithography", ISSC 83 Digest of Technical Papers, 1983.

Primary Examiner—Stanley D. Miller
Assistant Examiner—David R. Bertelson
Attorney, Agent, or Firm—Schwartz, Jeffery, Schwaab, Mack, Blumenthal & Evans

[57] ABSTRACT

A logic circuit comprises a first MOS transistor of a first conductive type having a gate connected to an input-/output line and a source connected to a first power source, a second MOS transistor of a second conductive type having a gate connected to the drain of the first MOS transistor, a source connected to a second power source, and a drain connected to the gate of the first MOS transistor, and a capacitor connected across the gate and source of the second MOS transistor. With the logic circuit of the invention it is possible to change a logic level without forming a direct path. This makes it possible to reduce load of a boosting circuit and a power supply. Also it can be used in a waveform shaping circuit.

6 Claims, 9 Drawing Figures

F I G. 2
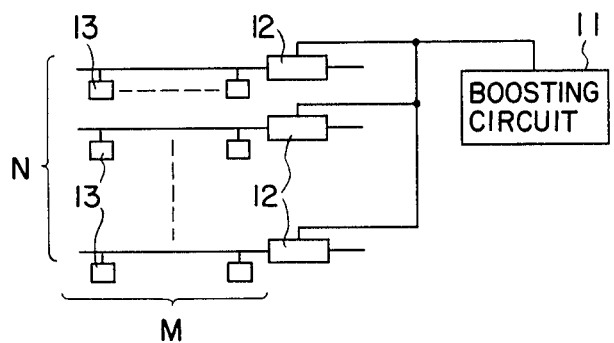
F I G. 3
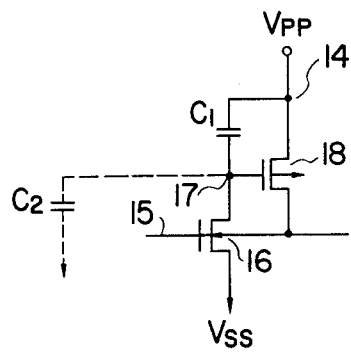
F I G. 4
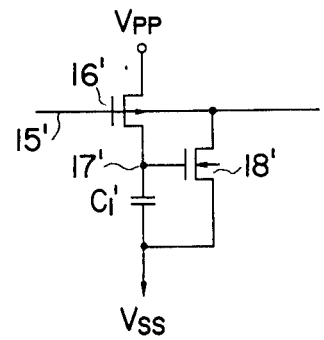

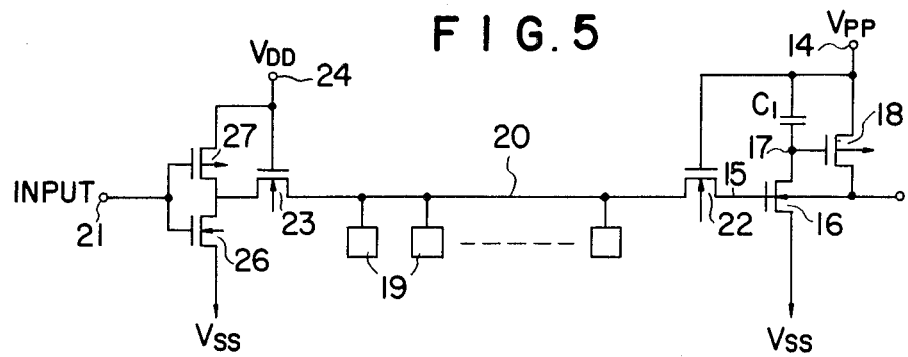
FIG. 5
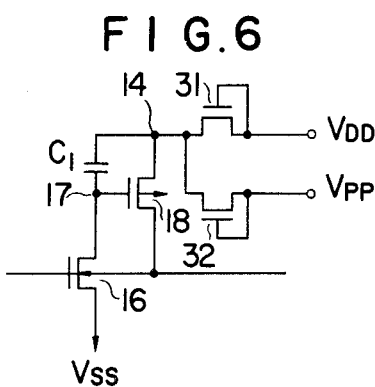
FIG. 6
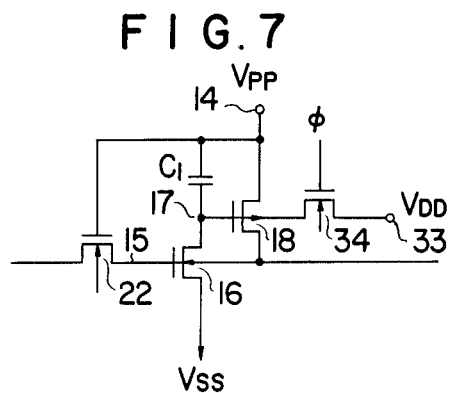
FIG. 7
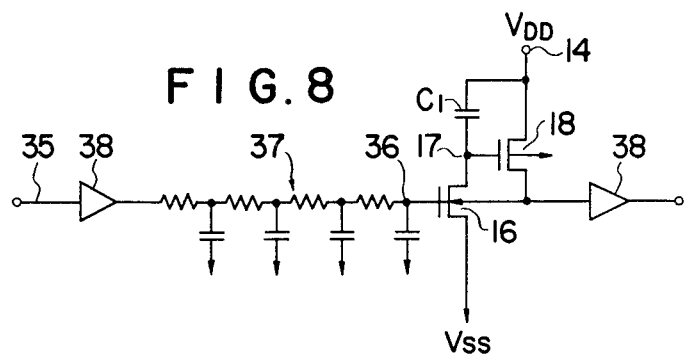
FIG. 8
FIG. 9

HIGH VOLTAGE BOOTSTRAPPING BUFFER CIRCUIT

BACKGROUND OF THE INVENTION

The present invention relates to a logic circuit which operates on different voltages, for example, voltages of a normal logic level and a high logic level.

A E$^2$PROM (Electrically Erasable and Programmable ROM) operates on a high voltage (20 V or more) when new information is written in the E$^2$PROM. However, it is required that the E$^2$PROM uses only 5 V power supply and does not need a separate high voltage supply for programming. For this reason, the E$^2$PROM usually has a circuit for boosting a voltage from 5 V to 20 V. The boosting circuit in the E$^2$PROM generally has a high impedance and is capable of producing only a limited current. Therefore, a logic circuit of the type operating on both a normal voltage and a high voltage, such as a E$^2$PROM, should require only a low power dissipation.

FIG. 1 shows a conventional logic circuit of the above-mentioned type. The logic circuit has an input terminal 1, an output terminal 2, a terminal 3 to which the normal voltage (5 V) is applied, and a terminal 4 to which the normal voltage (5 V) or the high voltage (20 V) is selectively applied. A voltage $V_2$ on the output terminal 2 ranges from 0 V to 5 V when the normal voltage (5 V) is applied to the terminal 4. The voltage $V_2$ ranges from 0 V to 20 V when the high voltage is applied to the terminal 4.

In the logic circuit, while the voltage $V_{PP}$ applied to the terminal 4 is raised from 5 V to 20 V, a large through current flows in the logic circuit. This result in a large power dissipation. If the ability of a boosting circuit 6 is not enough to supply the large through current, the boosting circuit 6 cannot raise the voltage $V_2$ to the high voltage.

Further consideration is given to the above-mentioned problem. First, it is assumed that an NMOS transistor 7 is conductive and a voltage $V_5$ of a line 5 is at a low level. When the voltage $V_{PP}$ of the terminal 4 is increased, the voltage $V_2$ of the output terminal 2 is increased following a rise in the voltage $V_{PP}$. However, the increase in the voltage $V_2$ of the output terminal 2 lags behind the increase in the voltage $V_{PP}$. Thus during the increment of the voltages, the relationship between the voltages $V_2$ and $V_{PP}$ is as follows:

$$|V_2 - V_{PP}| > |V_{thp}|,$$

where $V_{thp}$ is a threshold voltage of a PMOS transistor 9. Thus PMOS transistor 9 is on. As the PMOS transistor 9 and the NMOS transistor 7 are on at the same time, a through current is generated which flows from the terminal 4 to a power source $V_{SS}$ via the PMOS transistor 9, the line 5 and the NMOS transistor 7.

Secondly, it is assumed that the voltage $V_5$ is at a high level. Then, an NMOS transistor 10 is on, and a PMOS transistor is on because the voltage 2 is at a low level. When the voltage $V_{PP}$ is increased, the voltage $V_5$ is increased following a rise in the voltage $V_{PP}$. However, the increase in the voltage $V_5$ of the line 5 lags behind the increase in the voltage $V_{PP}$. Thus, during the increment of the voltages, the relationship between the voltages $V_5$ and $V_{PP}$ is as follows:

$$|V_{PP} - V_5| > |V_{thp}|$$

where $V_{thp}$ is a threshold voltage of a PMOS transistor 8. Thus the PMOS transistor 8 is on. As the PMOS transistor 8 and the NMOS transistor 10 are on at the same time, a through current is generated.

As described above, a large through current is generated in the conventional logic circuit during a rise in the voltage $V_{PP}$. FIG. 2 shows a E$^2$PROM which includes drivers 12 using the logic circuits. N drivers 12 are connected to M cells 13, respectively. A boosting circuit 11 is common to the N drivers 12. When the voltage $V_{PP}$ is raised from 5 V to 20 V, the boosting circuit 11 must drive the N drivers 12 to supply all N through currents of the drivers 12. If a storage capacity of the E$^2$PROM is 64 kilo bits, the number N is 256. The sum of 256 through currents is so large that the boosting circuit 11 cannot supply them. Thus the boosting circuit 11 cannot raise an output voltage of the drivers 12 to the high voltage. Even if the boosting circuit 11 can raise the output voltage of the drivers 12, its waveform is greatly distorted. And also the large through currents result in a large power dissipation.

SUMMARY OF THE INVENTION

An object of the present invention is to provide a logic circuit being operable on both a normal logic level and a high logic level, and generating no through current during a change in a logic level.

This object has been attained by the logic circuit comprising a first MOS transistor of a first conductive type having a gate connected to an input/output line and a source connected to a first power source, a second MOS transistor of a second conductive type having a gate connected to the drain of the first MOS transistor, a source connected to a second power source, and a drain connected to the gate of the first MOS transistor, and a capacitor connected across the gate and source of the second MOS transistor.

BRIEF DESCRIPTION OF THE DRAWINGS

FIG. 2 is a circuit diagram showing a decoder circuit of a E$^2$PROM which uses the logic circuits of the type shown in FIG. 1;

FIG. 3 is a circuit diagram showing a logic circuit according to one embodiment of the present invention;

FIG. 4 is a circuit diagram showing one modification of the logic circuit of FIG. 3;

FIG. 5 is a circuit diagram showing a decoder circuit of a E$^2$PROM which uses the logic circuit of FIG. 3;

FIG. 6 is a circuit diagram showing another modification of the logic circuit of FIG. 3;

FIG. 7 is a circuit diagram showing a logic circuit according to another embodiment of the present invention;

FIG. 8 is a circuit diagram showing a waveform shaping circuit which uses the logic circuit of FIG. 3; and FIG. 9 is a graph showing the characteristics of the waveform shaping circuit.

DETAILED DESCRIPTION OF THE INVENTION

Figure 1:
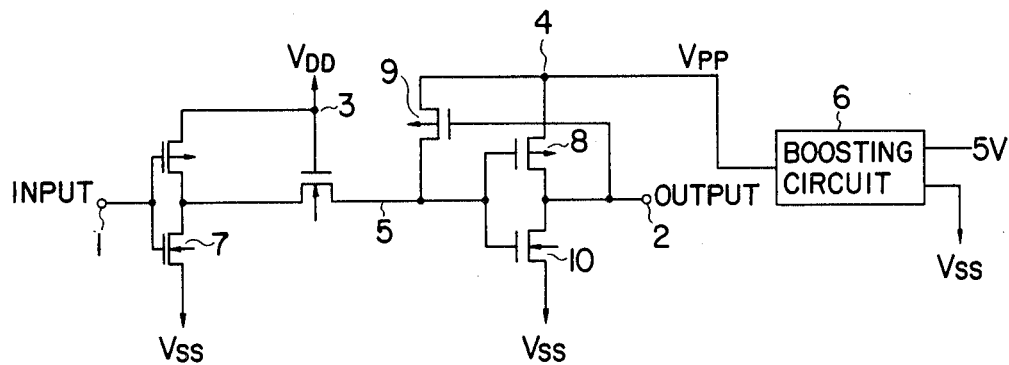
FIG. 1 is a circuit diagram showing a prior art logic circuit.

FIG. 3 shows a logic circuit according to one embodiment of the present invention. The logic circuit comprises a capacitor C$_1$, an NMOS transistor 16, and a PMOS transistor 18. A voltage $V_{SS}$ is applied to a source of the NMOS transistor 16. A gate of the transistor 16 is connected to a drain of a PMOS transistor 18, and its drain is connected to a gate of the PMOS transistor 18. A voltage $V_{PP}$ is applied to a source of the PMOS transistor 18. The capacitor $C_1$ is connected across the gate and the source of the PMOS transistor 18. The capacitor $C_1$ has a sufficiently large capacitance. The critical value of the capacitance will be understood from the description given later. A node 17 which is connected to the capacitor $C_1$, the gate of the PMOS transistor 18 and the drain of the NMOS transistor 16 has a parasitic capacitance $C_2$. An input/output line 15 is connected to the gate of the NMOS transistor 16.

The description will be given on the operation of the logic circuit at the time when the voltage $V_{PP}$ is raised from 5 V to 20 V. When a voltage of a line 15 is at a high level (5 V), the NMOS transistor 16 is on because a high level is applied to its gate. The PMOS transistor 18 is on because the node 17 connected to its gate is at a low level. Thus the voltage of the line 15 is increased following a rise in the voltage $V_{PP}$. Since the voltage of line 15 is at a high level, a current sink transistor connected to the line 15 is off. For this reason, a direct path for a through current is not formed. A current through the PMOS transistor 18 is used only for charging the line 15.

When the voltage of the line 15 is at a low level (0 V), the NMOS transistor 16 is off because a low level is applied to its gate. A voltage of the node 17 is increased with little delay following a rise in the voltage $V_{PP}$, because the capacitor $C_1$ has a large capacitance. As a result, a voltage difference between the source and the gate of the PMOS transistor 18 is smaller than a threshold voltage $V_{thp}$ of the PMOS transistor 18, and the PMOS transistor 18 is off. A direct path for a through current is not formed. Then, only a current for charging the capacitor $C_1$ flows through a terminal 14.

In order for the voltage difference between the source and gate of the PMOS transistor 18 to be smaller than the threshold voltage $V_{thp}$, the following condition must be met.

$$\frac{C_2}{C_1 + C_2} V_{PP} << |V_{thp}| \quad (1)$$

In the present embodiment, the parasitic capacitance $C_2$ comprises a gate capacitance of the PMOS transistor 18 and a drain capacitance of the NMOS transistor 16. These capacitances are about 20 fF each. Where $V_{PP}=20V$ and $V_{thp}=0.8$ V, relation $C_1 >> 480$ fF can be obtained from relation (1). Therefore the capacitance of the capacitor $C_1$ is preferably sufficiently larger than 480 fF.

As stated above, this embodiment enables changing of a logic level without forming a direct path.

FIG. 4 shows one modification of the logic circuit of FIG. 3. In the logic circuit, a capacitor $C_1'$ corresponds to the capacitor $C_1$, a PMOS transistor 16' corresponds to the NMOS transistor 16, and an NMOS transistor 18' corresponds to the PMOS transistor 18. The voltage $V_{PP}$ is applied to a source of the PMOS transistor 16'. Its gate is connected to a drain of the NMOS transistor 18' and its drain is connected to a gate of the NMOS transistor 18'. The voltage $V_{SS}$ is applied to a source of the NMOS transistor 18'. The capacitor $C_1'$ is connected across the gate and the source of the NMOS transistor 18'. The capacitor $C_1'$ has a large capacitance. An input/output line 15' is connected to the gate of the NMOS transistor 16'. The modification also makes it possible to change a logic level without forming a direct path similarly as the logic circuit shown in FIG. 3.

FIG. 5 shows a decoder circuit of an E²PROM which uses the logic circuit of FIG. 3. Plural memory cells 19 are connected to a word line 20. One end of the word line 20 is connected to a logic circuit via a transfer gate 22. The transfer gate 22 selectively enables or disables application of an input signal to the logic circuit. The other end of the word line 20 is connected to an inverter consisting of a PMOS transistor 27 and an NMOS transistor 26 via a transfer gate 23.

In reading mode in which some information is read from the E²PROM, a voltage $V_{DD}$ of a terminal 24 is 5 V and a voltage $V_{PP}$ of a terminal 14 is 0 V. Since 0 V is applied to a gate of the transfer gate 22, the transfer gate 22 is off and the word line 20 is not electrically connected to the logic circuit. Therefore, a voltage of the word line 20 ranges from 0 V to 5 V in response to an input signal of an input terminal 21.

In programming mode in which information is written in the E²PROM, the word line 20 must be raised to a high voltage when any memory cell connected to the word line 20 is selected. Firstly the input signal is turned into a low level (0 V) and then the voltage of the word line 20 is $V_{DD} - V_{thn}$, where $V_{thn}$ is a threshold voltage of the NMOS transistor 23. Secondly the voltage $V_{PP}$ is raised from 0 V to $(20 + V_{thn})V$. Then the transfer gate 22 is on and the NMOS transistor 16 is on. Thus the voltage of the node 17 becomes a low level and the PMOS transistor 18 is on. As a result, the voltage of the word line 20 is raised to 20 V. During a rise in the voltage $V_{PP}$, the input signal is at a low level and the NMOS transistor 26 is off. Therefore, no through current is flowing from the terminal 14 to the NMOS transistor 26 via the PMOS transistor 18 and the word line 20. A voltage of a drain of the PMOS transistor 27 is always lower than the voltage $V_{DD}$ during a rise of the voltage $V_{PP}$. While the voltage $V_{PP}$ is decreased after programming, a voltage of the drain of the PMOS transistor 27 is decreased following a drop in the voltage $V_{PP}$. During a drop in the voltage $V_{PP}$, the transfer gate 22 is turned off, and then the voltage of the word line 20 remains at a certain voltage between 0 V and 20 V. When the input signal is turned into a high level, the NMOS transistor is on and the voltage of the word line 20 is decreased to a low level.

When any memory cell connected to the word line 20 is not selected, the input signal is turned into a high level and the voltage of the word line 20 is turned into a low level. Next, the voltage $V_{PP}$ is increased in order to make other word lines to be a high level, and then the transfer gate 22 turns off. Since the NMOS transistor 23 is off and the capacitor $C_1$ has a large capacitance, the voltage of the node 17 is increased following a rise of the voltage $V_{PP}$. Therefore, the PMOS transistor 18 remains off and the voltage of the word line 20 remains at a low level.

As stated above, no through current is generated in the E²PROM using the logic circuit. This makes it possible to reduce a load of a boosting circuit. Since the logic circuit is constituted by a small number of elements, it can be formed on a small area in a semiconductor substrate. Also, the logic circuit according to the embodiment does not require any spacial power source providing a voltage between the normal logic level and the high logic level.

In the decoder circuit as shown in FIG. 5, the transfer gate 22 is inserted between the logic circuit and the word line 20. However, if the voltage $V_{PP}$ is always higher than the voltage $V_{DD}$, the transfer gate 22 can be omitted.

FIG. 6 shows a logic circuit in which the transfer gate 22 is omitted. In order for the voltage of the terminal 14 to be always higher than the voltage $V_{DD}$, the terminal 14 is connected to the voltage $V_{PP}$ via a MOS transistor 32 and to the voltage $V_{DD}$ via a MOS transistor 31. A gate of the MOS transistor 31 is connected to the voltage VDD and a gate of the MOS transistor 32 is connected to the voltage $V_{PP}$. Even if the voltage $V_{PP}$ is lower than the voltage $V_{DD}$, the voltage of the terminal 14 is always higher than the voltage $V_{DD}$ because the voltage $V_{DD}$ is applied to the terminal 14 via the MOS transistor 31.

FIG. 7 shows a logic circuit according to another embodiment of the present invention. This logic circuit further comprises an NMOS transistor 34 connected to the node 17 to serve for precharging. The NMOS transistor 34 is inserted in series between the node 17 and a terminal 33. A control signal $\phi$ is applied to the gate of the NMOS transistor 34. The voltage $V_{DD}$ of a normal logic level is applied to the terminal 33. When the voltage $V_{PP}$ is 20 V, the control signal $\phi$ is at a low level. Then the NMOS transistor is off. When the voltage $V_{PP}$ is 0 V, the control signal $\phi$ is at a high level. Then the NMOS transistor is on. As a result, the node 17 is pre-charged to $V_{DD} - V_{th}$, where $V_{th}$ is a threshold voltage of the NMOS transistor 34. Therefore, relation (1) is modified as follows:

$$\frac{C_2}{C_1 + C_2} V_{PP} \ll V_{thp} + V_{DD} - V_{th} \qquad (2)$$

Where $V_{PP}=20$ V, $V_{thp}=V_{th}=0.8$ V, and $C_2=20$ fF, relation $C_1 \gg 60$ fF can be obtained from relation (2). Therefore, a capacitance of the capacitor $C_1$ is reduced by a factor of 8 of the capacitor $C_1$ of FIG. 3, and the capacitor $C_1$ can be formed on a smaller area. Also the logic circuit can operate with stability.

FIG. 8 shows a waveform shaping circuit which uses the logic circuit of FIG. 3. A node 36 of a line 37 is connected to the logic circuit. A wiring formed in an integrated circuit is generally equivalent to an RC distributed constant circuit. When an input signal with a step rise illustrated by curve (a) in FIG. 9 is applied to an input line 35, a signal appearing at the node 36 is of a waveform which rises slowly as illustrated by curve (b). This is because of a function of a gate 38 and the line 37. In prior art, a signal at the node 36 is directly applied to an input of a following gate 38. A threshold voltage $V_{38}$ of the gate 38 is generally about one-half of the voltage $V_{DD}$, because it is difficult to lower the input conductance of the gate 38. Therefore, an output signal of the gate 38 rises at time $t_2$ when a voltage of the node 36 reaches the threshold voltage $V_{38}$ (curve (d)). However, with the waveform shaping circuit shown in FIG. 8, the node 36 is connected to a gate of the NMOS transistor 16. Thus an input signal, and hence an output signal of the gate 38 rise at time $t_1$ when the voltage of the node 36 reaches a threshold voltage $V_{th}$ of the NMOS transistor 16 (curve (c)). According to the waveform shaping circuit, the output signal of the gate 38 rises up earlier by $\Delta t$ as shown in FIG. 9. Therefore, the waveform shaping circuit can rapidly shape a waveform of a signal. Also, since an input and an output of the waveform shaping circuit are in the same logical state, it is not necessary to provide an inverter which inverts a logical state.

The waveform shaping circuit of FIG. 8 can shape a waveform of a rising signal. However, in order to shape a waveform of a falling signal, the logic circuit of FIG. 4 may be used instead of the logic circuit of FIG. 3.

The logic circuit according to the present invention may be formed as an integrated circuit. Also it may be formed by discrete elements, such as MOS transistor devices and capacitor devices.

As stated above, with the present invention it is possible to operate on both a normal logic level and a high logic level and to change a logic level without forming a direct path. This makes it possible to reduce load of a boosting circuit and a power supply. Also since the logic circuit according to the present invention is constituted by a small number of elements, it can be formed on a small area. Further, it does not require any spacial power source. Furthermore, a waveform shaping circuit using the logic circuit can rapidly shape a waveform of an input signal.

What is claimed is:

1. A logic circuit comprising:
   a first MOS transistor of a first conductive type having a gate connected to an input/output line and a source connected to a first power source;
   a second MOS transistor of a second conductive type having a gate connected to the drain of the first MOS transistor, a source connected to a second power source, and a drain connected to the gate of the first MOS transistor; and
   a capacitor connected across the gate and source of the second MOS transistor.

2. A logic circuit according to claim 1, wherein the first MOS transistor is an n-channel MOS transistor and the second MOS transistor is a p-channel MOS transistor.

3. A logic circuit according to claim 1, wherein the first MOS transistor is a p-channel MOS transistor and the second MOS transistor is an n-channel MOS transistor.

4. A logic circuit comprising:
   a first MOS transistor of a first conductive type having a gate connected to an input/output line and a source connected to a first power source;
   a second MOS transistor of a second conductive type having a gate connected to the drain of the first MOS transistor, a source connected to a second power source, and a drain connected to the gate of the first MOS transistor;
   a capacitor connected across the gate and source of the second MOS transistor; and
   a third MOS transistor inserted in series between the gate of the first MOS transistor and the input terminal for selectively enabling or disenabling application of an input signal to the gate of the first MOS transistor, the third MOS transistor having a gate connected to the second power source.

5. A logic circuit comprising:
   a first MOS transistor of a first conductive type having a gate connected to an input/output line and a source connected to a first power source;
   a second MOS transistor of a second conductive type having a gate connected to the drain of the first MOS transistor, a source connected to a second power source, and a drain connected to the gate of the first MOS transistor;

a capacitor connected across the gate and source of the second MOS transistor;

a third MOS transistor inserted in series between the source of the second MOS transistor and said second power source providing a voltage of a normal logic level, the third MOS transistor having a gate connected to the second power source; and a fourth MOS transistor inserted in series between the source of the second MOS transistor and a third power source providing a voltage higher than the voltage of the normal logic level, the fourth MOS transistor having a gate connected to the third power source.

6. A logic circuit comprising:

a first MOS transistor of a first conductive type having a gate connected to an input/output line and a source connected to a first power source;

a second MOS transistor of a second conductive type having a gate connected to the drain of the first MOS transistor, a source connected to a second power source, and a drain connected to the gate of the first MOS transistor;

a capacitor having first and second terminals connected to the gate and source of the second MOS transistor, respectively; and a third MOS transistor inserted in series between a third power source providing a voltage of a normal logic level and the first terminal of the capacitor, a control signal being applied to the gate of the third MOS transistor so as to make the third MOS transistor conductive, whereby the first terminal of the capacitor is pre-charged to the voltage of the normal logic level when the second power source is not providing a voltage.

* * * * *